United States Patent
Chang et al.

(10) Patent No.: US 10,014,252 B2
(45) Date of Patent: Jul. 3, 2018

(54) INTEGRATED CIRCUIT WITH MULTI-LEVEL ARRANGEMENT OF E-FUSE PROTECTED DECOUPLING CAPACITORS

(71) Applicant: Taiwan Semiconductor Manufacturing Company, Ltd., Hsin-Chu (TW)

(72) Inventors: Shih-Cheng Chang, Hsin-Chu (TW); Liang-Chen Lin, Baoshan Shiang (TW); Fu-Tsai Hou, Hsin-Chu (TW); Tung-Chin Yeh, Toufen Township (TW); Shih-Kai Lin, Hsin-Chu (TW); Gia-Her Lu, Zhubei (TW); Jyun-Lin Wu, Hsin-Chu (TW); Hsien-Pin Hu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/201,122

(22) Filed: Jul. 1, 2016

(65) Prior Publication Data
US 2016/0315050 A1    Oct. 27, 2016

Related U.S. Application Data

(62) Division of application No. 14/334,389, filed on Jul. 17, 2014, now Pat. No. 9,385,079.

(60) Provisional application No. 61/933,182, filed on Jan. 29, 2014.

(51) Int. Cl.
*H01L 23/525* (2006.01)
*H01L 23/522* (2006.01)
(Continued)

(52) U.S. Cl.
CPC ...... *H01L 23/5256* (2013.01); *H01L 23/5223* (2013.01); *H01L 23/5286* (2013.01); *H01L 23/53295* (2013.01); *H01L 2924/0002* (2013.01)

(58) Field of Classification Search
CPC ............. H01L 23/5256; H01L 23/5223; H01L 23/5286; H01L 23/53295; H01L 23/525;
(Continued)

(56) References Cited

U.S. PATENT DOCUMENTS 7,884,409 B2    2/2011 Kim et al.
7,919,802 B2 *  4/2011 Lin ..................... H01L 23/5223
                                                      257/303
(Continued)

FOREIGN PATENT DOCUMENTS

CN    101261979 A    9/2008
CN    101753008 A    6/2010
(Continued)

*Primary Examiner* — Marc Armand
*Assistant Examiner* — Younes Boulghassoul
(74) *Attorney, Agent, or Firm* — Slater Matsil, LLP

(57) ABSTRACT

An embodiment is a circuit. The circuit includes active circuitry, a first capacitor, a first fuse, a second capacitor, and a second fuse. The active circuitry has a first power node and a second power node. The first capacitor is coupled to the first fuse serially to form a first segment. The second capacitor is coupled to the second fuse serially to form a second segment. The first segment and the second segment are coupled together in parallel and between the first power node and the second power node.

20 Claims, 5 Drawing Sheets

(51) Int. Cl.
*H01L 23/532* (2006.01)
*H01L 23/528* (2006.01)

(58) Field of Classification Search
CPC ..... H01L 23/62; H01L 23/522; H01L 23/532; H01L 23/528; H01L 23/5222; H01L 23/5228; H01L 23/53271; H01L 29/92; H01L 29/8605; H01L 29/86; H01L 28/40; H01L 28/20; H01L 28/24; H01L 28/60; H01L 27/01; H01L 27/016; H01L 27/11206; H01L 2924/0002; H01L 21/02; H01L 21/20; H01L 49/02; H01G 4/20
USPC ............... 257/529, 533, 532, 536, 528, 296, 257/E29.001, E29.342, E29.326, E29.325, 257/E21.008, E21.004, E21.553, E21.003, 257/E23.142; 438/382, 384, 396; 361/313; 327/525
See application file for complete search history.

(56) References Cited

U.S. PATENT DOCUMENTS

| | | | |
|---|---|---|---|
| 8,610,188 B2 | 12/2013 | Kerber et al. | |
| 8,749,020 B2 | 6/2014 | Chen et al. | |
| 8,907,446 B2 | 12/2014 | Summerfelt et al. | |
| 9,425,192 B2 | 8/2016 | Rahim et al. | |
| 2004/0085120 A1 | 5/2004 | Pitts | |
| 2007/0235880 A1* | 10/2007 | Yang | H01L 23/5223 257/773 |
| 2008/0001256 A1 | 1/2008 | Remmel et al. | |
| 2008/0217735 A1 | 9/2008 | Chen et al. | |
| 2009/0017591 A1 | 1/2009 | Cervin-Lawry et al. | |
| 2009/0236689 A1 | 9/2009 | Daly et al. | |
| 2010/0006912 A1* | 1/2010 | Larsen | G11C 11/4125 257/296 |
| 2010/0148304 A1 | 6/2010 | Rahim et al. | |
| 2011/0070718 A1 | 3/2011 | Kim et al. | |
| 2012/0056667 A1 | 3/2012 | Feng et al. | |
| 2014/0239445 A1* | 8/2014 | Nishimura | H01L 23/5228 257/532 |
| 2014/0264751 A1 | 9/2014 | Chen et al. | |
| 2015/0162397 A1* | 6/2015 | Chiou | H01L 28/40 257/529 |

FOREIGN PATENT DOCUMENTS

| | | |
|---|---|---|
| CN | 2012109403 A | 6/2012 |
| JP | 2005123376 A | 5/2005 |
| KR | 1020070000758 A | 1/2007 |
| KR | 100764741 | 10/2007 |

\* cited by examiner

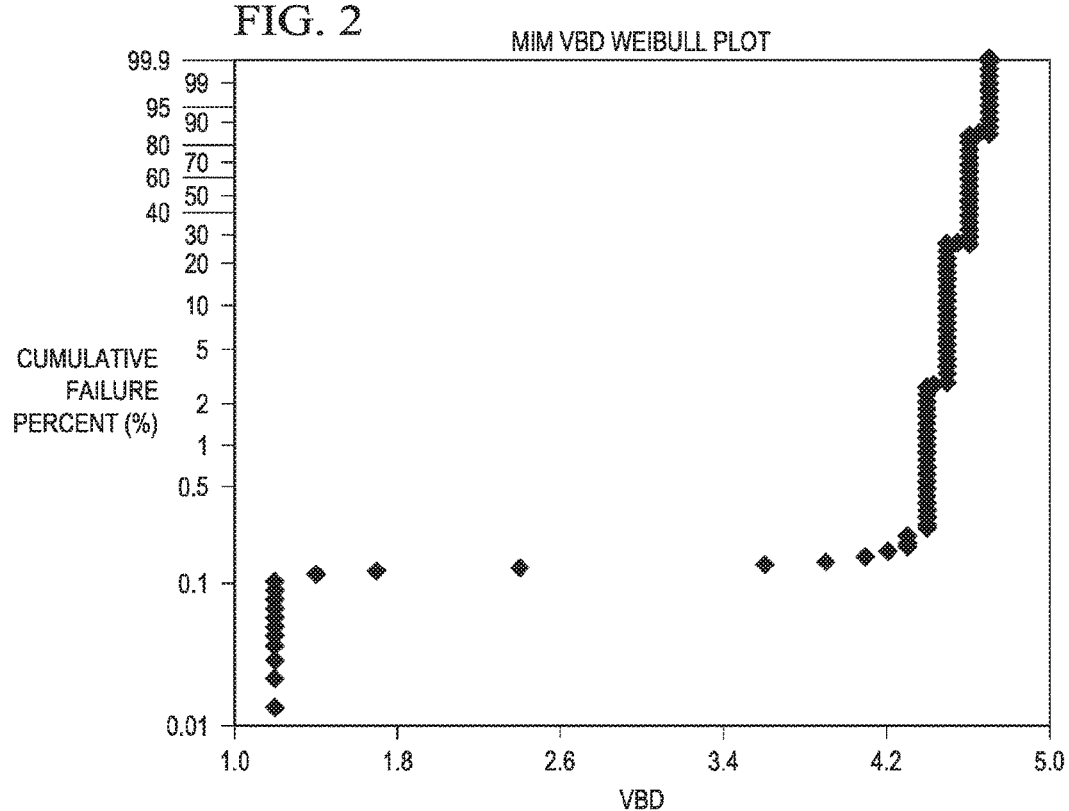
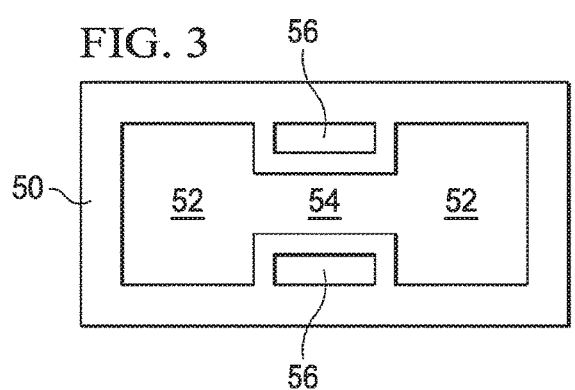

_US 10,014,252 B2_

INTEGRATED CIRCUIT WITH MULTI-LEVEL ARRANGEMENT OF E-FUSE PROTECTED DECOUPLING CAPACITORS

PRIORITY CLAIM AND CROSS-REFERENCE

This application claims priority to and the benefit of U.S. patent application Ser. No. 14/334,389, filed Jul. 17, 2014, entitled "Methods for Forming Stacked Capacitors with Fuse Protection," which claims priority to and the benefit of U.S. Provisional Application Ser. No. 61/933,182, filed on Jan. 29, 2014, entitled "MiM Capacitors with E-Fuse Protection," which applications are hereby incorporated herein by reference in its entirety.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits typically include field-effect transistors (FETs).

Reliability of semiconductor devices is generally a large concern when manufacturing those devices. With the ever increasing density and decreasing footprint requirements of modern semiconductor processing, reliability faces ever greater problems. Reliability concerns may arise due to, for example, small pitches between devices such as transistors that cause overlay problems or from breakdown of thin films used in devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a chart illustrating an increase in reliability in accordance with some embodiments.

FIGS. 3 through 6 are various layout patterns of fuses that can be used in accordance with some embodiments.

DETAILED DESCRIPTION

Figure 1A:
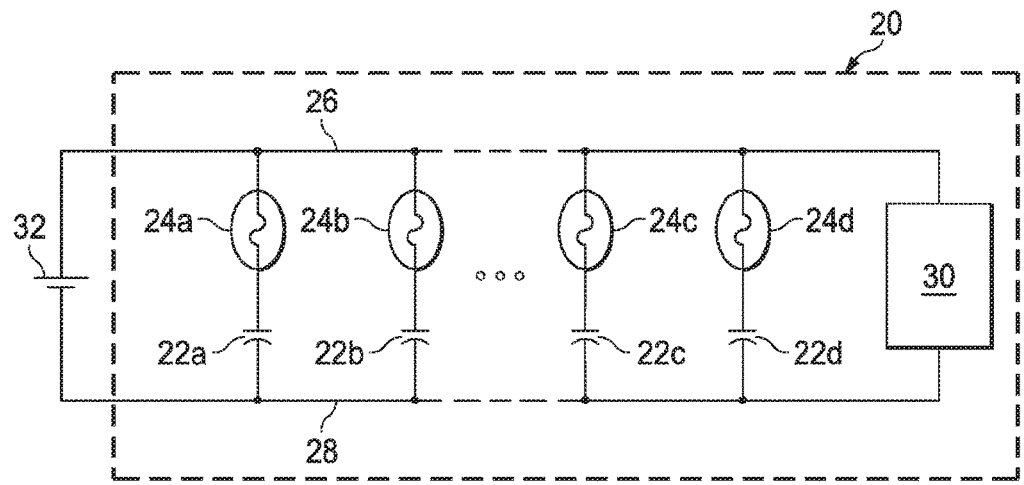
FIG. 1A is a chip comprising capacitors protected by fuses in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, method embodiments may be discussed as being performed in a particular order; however, other embodiments contemplate steps that are performed in any logical order.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely a fuse protection for a metal-insulator-metal (MiM) capacitor. Aspects of this disclosure may be applied to other configurations, such as a polysilicon-insulator-polysilicon (PiP) capacitor, or other devices.

FIG. 1A illustrates a chip 20 comprising capacitors 22 protected by fuses 24 according to an embodiment. The chip 20 may be an integrated circuit chip, an interposer, any substrate in and/or on which circuitry may be formed, or the like. In some embodiments, the chip 20 may be a System-On-Chip (SOC) integrated circuit chip and/or an integrated circuit chip used in a three dimensional integrated circuit (3DIC) package. The chip 20 comprises a first power rail 26, such as a VDD power rail, and a second power rail 28, such as a VCC or GND power rail. The first power rail 26 and the second power rail 28 are coupled to and supply power to circuitry 30. The circuitry 30 may be any circuitry, such as logic circuitry, analog circuitry, memory circuitry, or the like, and may comprise any combination of devices, such as passive devices like capacitors, inductors, or the like and active devices such as transistors. A power source 32, such as exterior to the chip 20, is coupled between the first power rail 26 and the second power rail 28. The chip 20 further comprises a serially coupled capacitor 22 and fuse 24 coupled between the first power rail 26 and the second power rail 28. Multiple serially coupled ones of capacitors 22a, 22b, 22c, and 22d (collectively "capacitors 22") and ones of fuses 24a, 24b, 24c, and 24d (collectively "fuses 24"), respectively, are coupled in parallel between the first power rail 26 and the second power rail 28. The capacitors 22 may be metal-insulator-metal (MiM) capacitors or the like. The fuses 24 may be electric fuses, or e-fuses, or the like.

Although illustrated as a single capacitor 22 and single fuse 24 being serially coupled between the first power rail 26 and the second power rail 28, additional components may be interposed between the first power rail 26 and the second power rail 28 and/or in other configurations. For example, as illustrated a fuse 24 is proximate the first power rail 26 and a capacitor 22 is proximate the second power rail 28; however, this may be switched. Further, additional capacitors may be serially coupled with a single fuse. For example, two capacitors and a fuse may be serially coupled, or two capacitors may be coupled together in parallel but in series with the fuse. Even further, other components, such as resistors, may be interposed between the first power rail 26 and the second power rail 28.

In operation, the power source 32 ideally would be a stable direct current (DC) power source to provide a constant voltage difference between the first power rail 26 and the second power rail 28. With this constant voltage difference, the capacitors 22 would behave as an open circuit between the first power rail 26 and the second power rail 28. With the capacitors 22 behaving as an open circuit, no current would flow through the fuses 24.

However, as is more typical, a voltage difference between the first power rail 26 and the second power rail 28 may have some fluctuation during operation. For example, the voltage difference between the first power rail 26 and the second power rail 28 may have some noise due to other circuitry in the chip 20 and/or due to the power source 32 being unable to provide sufficiently stable voltage, such as when the power source 32 includes a power converter. When fluctuations in the voltage difference between the first power rail 26 and the second power rail 28 occur, the capacitors 22 can smooth out or dampen the fluctuations such that the voltage supplied to the circuitry 30 is more stable. The ability of the capacitors 22 to smooth or dampen the fluctuations is a function, at least in part, of the combined capacitance value of the capacitors 22. Generally, the higher the combined capacitance value is, the higher the RC-time constant is, which can allow for better smoothing or dampening ability. Embodiments contemplate that any number of parallel capacitors 22 may be used. The parallel capacitors 22 may be referred to as an array of capacitors or a capacitor bank.

Typically, fluctuations in a voltage difference between the first power rail 26 and the second power rail 28 are small. With small fluctuations, a small amount of current may flow through the fuses 24 to and/or from the capacitors 22. In this operation, the current may be so small as to have no effect on the fuses 24 and the fuses 24 have no effect on the capacitors 22 or the smoothing or dampening of the fluctuations.

Figure 1B:
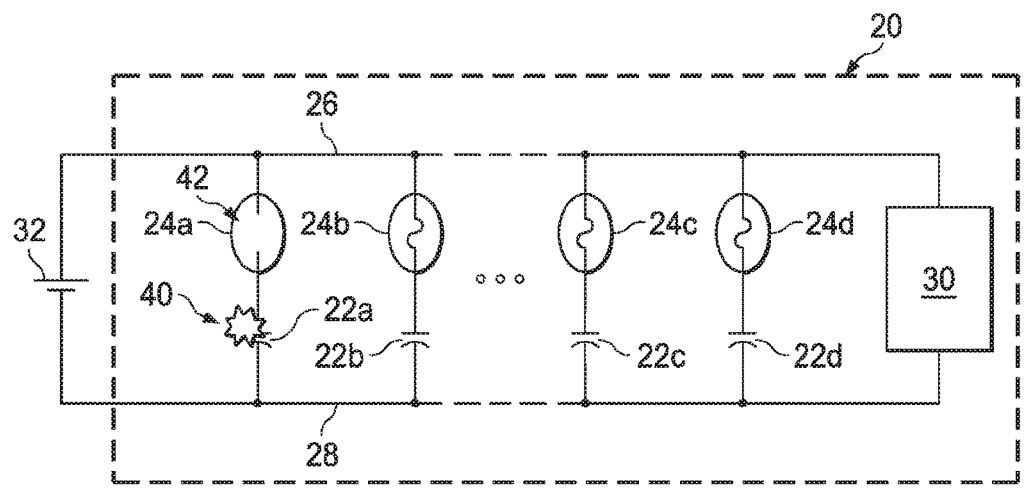
FIG. 1B is the chip of FIG. 1A where a capacitor has a defect in accordance with some embodiments.

In some instances, a defect may occur in a capacitor 22. As shown in FIG. 1B, a defect 40 occurs in capacitor 22a. The defect 40 may result from a manufacturing defect, a material breakdown (such as a dielectric material breakdown), a large spike in a voltage difference (such as from an electrostatic discharge (ESD) event), or the like. The defect 40 may cause a short circuit in the capacitor 22a. This short circuit may cause a large amount of current to flow through the serially coupled fuse 24a and capacitor 22a. This large amount of current may cause the fuse 24a to become blown 42, such as by electromigration of a conductive material resulting from the large current flowing through a fuse element of an e-fuse, to create an open circuit where the serially connected capacitor 22a and fuse 24a were. Hence, an otherwise defective capacitor 22a that could cause a short circuit is effectively removed from the operation of the circuit by the blowing of the fuse 24a. This can allow the chip 20 to remain functional despite the loss of the operation of the capacitor 22a. This can increase the overall reliability of the chip 20.

FIG. 2 is a chart illustrating an increase in reliability of embodiments. The x-axis is the voltage, such as a voltage difference between the first power rail 26 and the second power rail 28, at which breakdown of the chip occurs, and the y-axis is the cumulative failure percentage of chip samples manufactured. The chip samples each had a total area of 472 cm$^2$ for the capacitors, and the testing occurred at a temperature of 125° C. At a breakdown voltage of less than 1.2 V, there was a failure rate of approximately 0.1 percent. This is believed to be attributable to manufacturing defects. Through a breakdown voltage range from 1 V to 3.9 V, the failure rate remained approximately stable, such as approximately 0.1 percent. This may show that an insignificant number of failures of the chip samples occurred throughout the expected operating voltage of the samples.

FIGS. 3 through 6 illustrate various layout patterns of fuses that can be used in some embodiments. The patterns of the fuses are in a dielectric layer 50. Additional details of the materials and formation processes are discussed in more detail with respect to figures below.

FIG. 3 illustrates a first pattern of a fuse in the dielectric layer 50. The first pattern, which can include recesses filled with a conductive material, includes substantially rectangular contact pads 52 and a substantially rectangular fuse element 54 between the contact pads 52. The fuse element 54 has a small width. A ratio of a length of the fuse element 54 to the width of the fuse element 54 can be between about 2 and about 50. To sustain the blowing current without incurring damage, the contact pads 52 of the fuse preferably have a substantially greater width than the width of the fuse element 54. Substantially rectangular dummy portions 56 are formed on opposing sides of the fuse element 54 and disposed between the contact pads 52.

Figure 4:
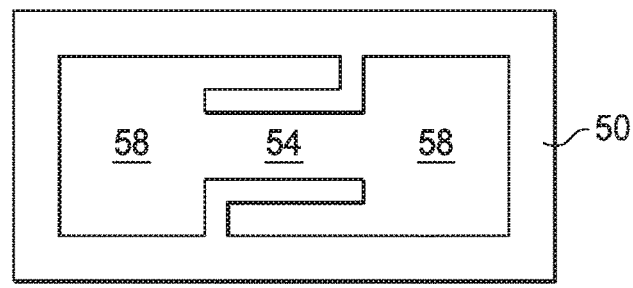

FIG. 4 is a second pattern of a fuse in the dielectric layer 50. This second pattern is similar to the first pattern in FIG. 3, except the dummy portions 56 of FIG. 3 are integrated into respective contact pads 58 in FIG. 4.

Figure 5:
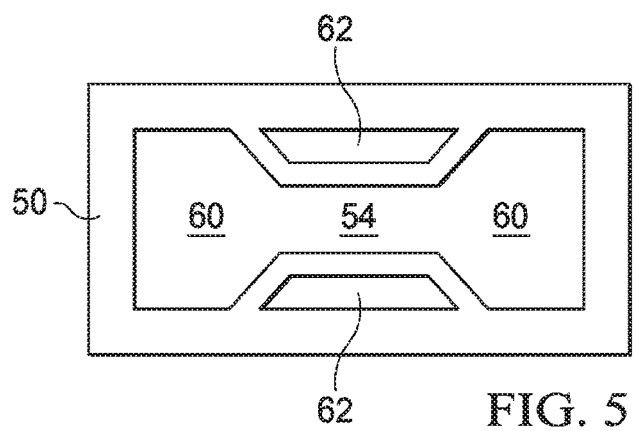

FIG. 5 is a third pattern of a fuse in the dielectric layer 50. This third pattern is similar to the first pattern in FIG. 3, except the contact pads 60 are tapered to the fuse element 54 and the dummy portions 62 are modified to accommodate the tapering of the contact pads 60.

Figure 6:
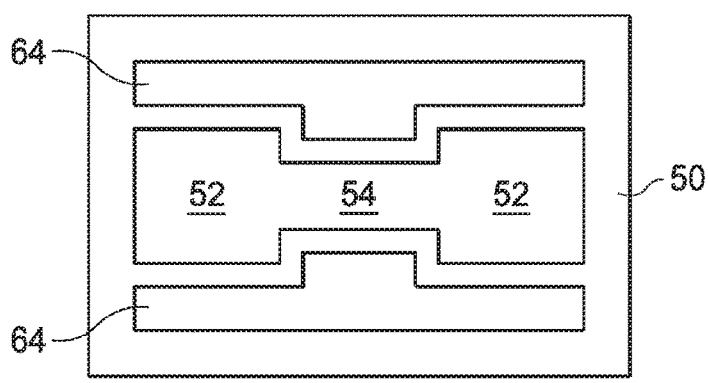

FIG. 6 is a fourth pattern of a fuse in the dielectric layer 50. This fourth pattern is similar to the first pattern in FIG. 3, except the dummy portions 56 of FIG. 3 are modified to be dummy portions 64 that include additional portions that extend the length of the fuse pattern along the contact pads 52.

The fuse patterns illustrated in FIGS. 3 through 6 are shown merely as examples. Other fuse patterns may be used. Additionally, further details of the fuse patterns shown in FIGS. 3 through 6 are discussed in U.S. Patent Publication No. 2008/0217735 (U.S. Ser. No. 11/716,206), which is hereby incorporated herein by reference in its entirety.

Figure 7:
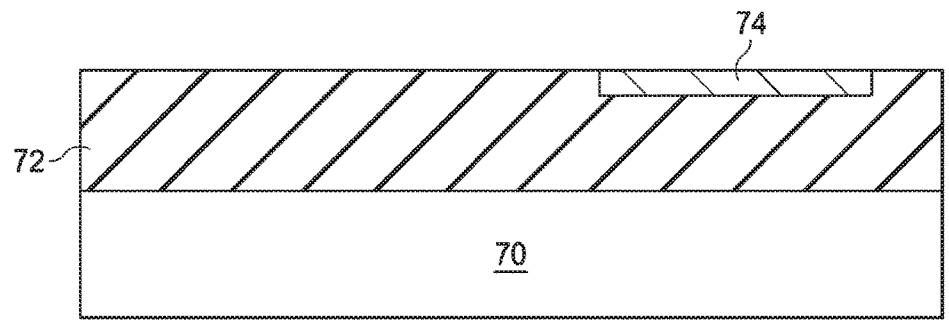
FIGS. 7 through 10 are cross section views of steps in forming a chip in accordance with some embodiments.

FIGS. 7 through 11 illustrate cross section views of steps in forming a chip in accordance with some embodiments. FIG. 7 illustrates a starting structure, which includes a substrate 70 and an overlying dielectric layer 72. Substrate 70 may include a semiconductor substrate on which devices, such as active and/or passive devices of the circuitry 30, may be formed. The semiconductor substrate may be a single crystalline or a compound semiconductor substrate. Other layers, such as a contact etch stop layer, an inter-layer dielectric, and an inter-metal dielectric, may also be included in substrate 70. The dielectric layer 72 may be an inter-metal dielectric layer, and may be formed of a low-K dielectric material, such as silicon oxide, tetraethyl orthosilicate (TEOS), phosphosilicate glass (PSG), borophosphosilicate glass (BPSG), fluorinated silicate glass (FSG), $SiO_xC_y$, Spin-On-Glass, Spin-On-Polymers, silicon carbon material, a combination thereof, or the like, formed by any suitable method, such as by chemical vapor deposition (CVD), plasma enhanced CVD (PECVD), spinning, the like, or a combination thereof.

A recessed pattern for forming a fuse 74 is etched into the dielectric layer 72. The recessed pattern may be any acceptable pattern, examples of which are provided in FIGS. 3 through 6. The etching process may be any acceptable process. The etching process may include forming and patterning a photoresist over the dielectric layer 72, etching with an anisotropic etch, such as a reactive ion etch (RIE), buffered oxide etch (BOE), or the like, to transfer the pattern of the photoresist to the dielectric layer 72, and removing the photoresist with an appropriate ashing and/or stripping process.

A conductive material is filled into the recessed pattern. The conductive material may include copper, a copper alloy, aluminum, tungsten, silver, and the like. A diffusion barrier layer (not shown) may be formed in the recessed pattern. A seed layer may be formed on the diffusion barrier layer using electroless plating, and then, the recessed pattern may be filled using electro-plating. After the filling, a top surface of conductive material may be higher than the top surface of dielectric layer 72. Any excess conductive material may be removed by a chemical mechanical polish (CMP) process. The remaining conductive material forms the fuse 74. This process may also be referred to as a damascene process. It is appreciated that the fuse 74 may be formed simultaneously with the formation of conductive lines and/or pads in the same metallization layer.

Figure 8:
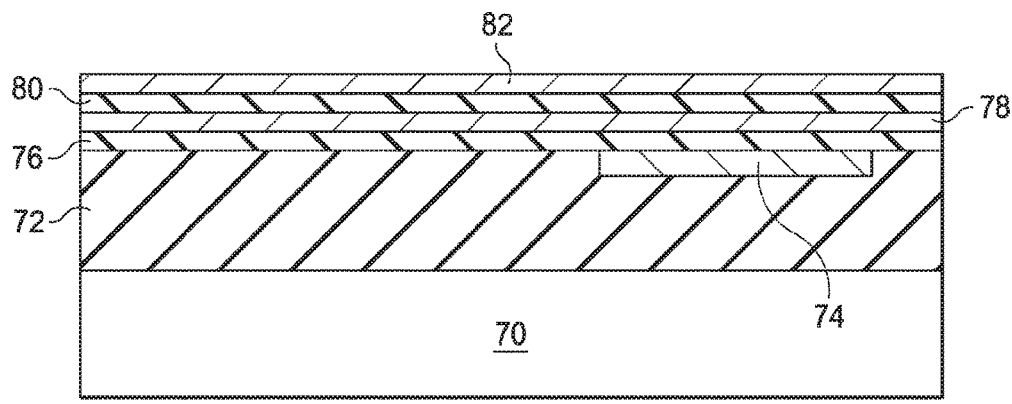

FIG. 8 illustrates an etch stop layer 76, a bottom electrode layer 78, a capacitor dielectric layer 80, and a top electrode layer 82 sequentially formed on the dielectric layer 72. The etch stop layer 76 is deposited on the dielectric layer 72 and may be formed of silicon nitride (SiN), silicon carbon nitride (SiCN), silicon carbon oxide (SiCO), carbon nitride (CN), a combination thereof, or the like, deposited by CVD, PECVD, the like, or a combination thereof. The etch stop layer 76 is formed of a dielectric material having a different etch selectivity from adjacent layers, e.g., the underlying layer and the overlying layer. The bottom electrode layer 78 is deposited on the etch stop layer 76. The capacitor dielectric layer 80 is deposited over the bottom electrode layer 78. The capacitor dielectric layer 80 may comprise a dielectric such as silicon dioxide ($SiO_2$), silicon nitride ($Si_3N_4$), a high-k dielectric such aluminum oxide ($Al_2O_3$), hafnium silicates (HfSiON), tantalum oxide ($Ta_2O_5$), zirconium oxide ($ZrO_2$), hafnium oxide ($HfO_2$), titanium oxide ($TiO_2$), barium strontium titanate oxide (BST), strontium titanate oxide (STO), the like, or a combination thereof deposited by PECVD, atomic layer deposition (ALD), the like, or a combination thereof. The top electrode layer 82 is deposited on the capacitor dielectric layer 80. The top electrode layer 82 and bottom electrode layer 78 may comprise titanium nitride (TiN), tantalum nitride (TaN), tungsten (W), tungsten nitride (WN), ruthenium (Ru), iridium (Ir), and platinum (Pt), Copper (Cu), Cu alloy, aluminum (Al), Al alloy, a combination thereof, or any other suitable material deposited by physical vapor deposition (PVD), CVD, electrical copper plating (ECP), the like, or a combination thereof.

Figure 9:
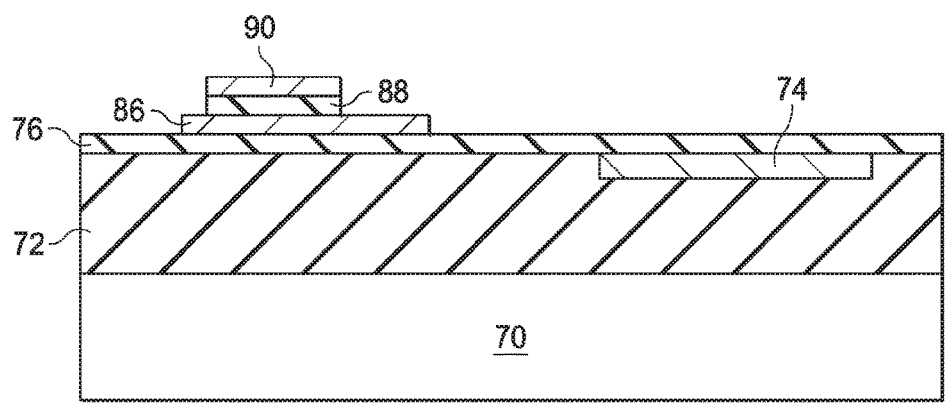

In FIG. 9, the top electrode layer 82, capacitor dielectric layer 80, and bottom electrode layer 78 are patterned to form a top electrode 90, capacitor dielectric 88, and bottom electrode 86 of a MiM capacitor. The patterning may be formed by using any acceptable etching process(es). For example, a first etching process may include forming and patterning a photoresist over the top electrode layer 82, etching with an anisotropic etch, such as a RIE, BOE, or the like, to transfer the pattern of the photoresist to the top electrode layer 82 and the capacitor dielectric layer 80, and removing the photoresist with an appropriate ashing and/or stripping process. Further, a second etching process may include forming and patterning a photoresist over the bottom electrode layer 78, etching with an anisotropic etch, such as a RIE, BOE, or the like, to transfer the pattern of the photoresist to the bottom electrode layer 78, and removing the photoresist with an appropriate ashing and/or stripping process. Although not illustrated, another etch stop layer may be formed over the MiM capacitor.

Figure 10:
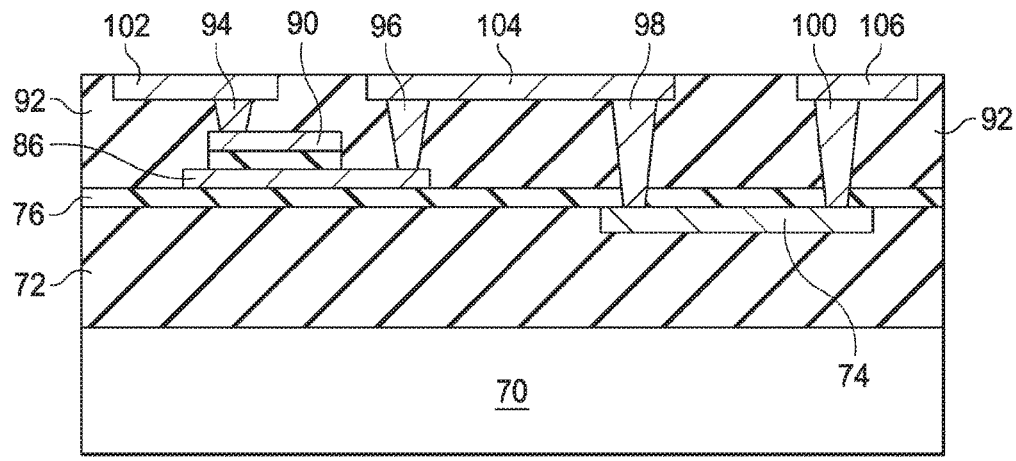

In FIG. 10, another dielectric layer 92 is formed over the MiM capacitor and the etch stop layer 76. The dielectric layer 92 may be an inter-metal dielectric layer, and may be formed of a low-K dielectric material, such as silicon oxide, TEOS, PSG, BPSG, FSG, $SiO_xC_y$, Spin-On-Glass, Spin-On-Polymers, silicon carbon material, compounds thereof, composites thereof, combinations thereof, or the like, formed by any suitable method, such as CVD, PECVD, spinning, the like, or a combination thereof.

Interconnect structures are formed in the dielectric layer 92 to interconnect the MiM capacitor and fuse 74 as discussed with respect to FIG. 1. For example, a damascene process, such as discussed above with respect to FIG. 7 may be used to form conductive lines 102, 104, and 106, and vias 94, 96, 98, and 100 in the dielectric layer 92. The conductive line 106 may be at least a portion of the first power rail 26. A via 100 directly couples the conductive line 106 to a contact pad (such as contact pad 52 of FIG. 3) of the fuse 74. Conductive line 104 and vias 96 and 98 serially couple the fuse 74 and the MiM capacitor. A via 98 directly couples the conductive line 104 to the other contact pad (such as contact pad 52 of FIG. 3) of the fuse 74. A via 96 directly couples the conductive line 104 to the bottom electrode 86 of the MiM capacitor. The conductive line 102 may be at least a portion of the second power rail 28. A via 94 directly couples the conductive line 102 to the top electrode 90 of the MiM capacitor.

In an embodiment, multiple MiM capacitors and fuses 74 are formed in the dielectric layers 72 and 92. For example, there may be multiple instances of a fuse 74 serially connected to a MiM capacitor by a conductive line 104 and vias 96 and 98 in the dielectric layers 72 and 92, and these multiple instances may be coupled together in parallel by the conductive lines 102 and 106 with multiple respective vias 94 and 100.

Figure 11:
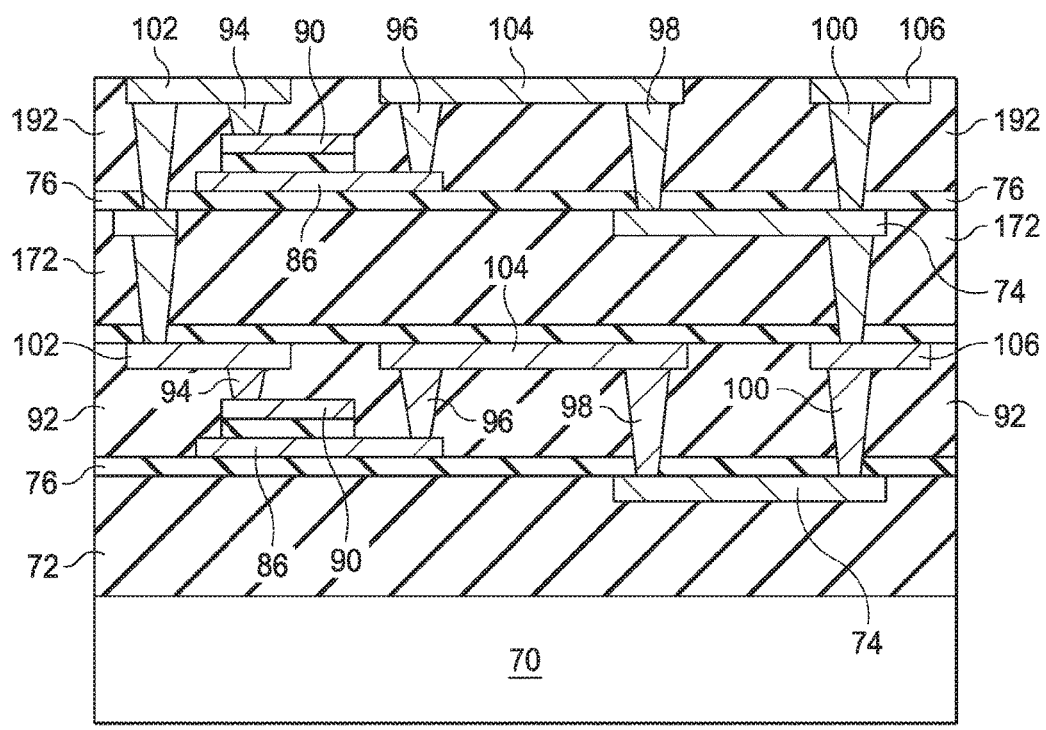
FIG. 11 is a cross section view of a chip in accordance with some embodiments.

In another embodiment, as shown in FIG. 11, multiple MiM capacitors and fuses 74 may be stacked across multiple dielectric layers, such as by repeating steps discussed herein. In such an embodiment, additional vias and contact pads may be formed in a dielectric layer, such as dielectric layer 172 to couple the MiM capacitors and fuses 74 in parallel. In other embodiments, multiple MiM capacitors and fuses 74 may be formed across two dielectric layers, e.g., dielectric layers 72 and 92 as discussed in FIG. 10, in combination with one or more instances of a MiM capacitor and a fuse 74 in two other dielectric layers, e.g., dielectric layers 172 and 192 in FIG. 11.

Although not specifically illustrated in FIGS. 7 through 11, the conductive lines 102 and 106 may be electrically coupled to circuitry, such as in the substrate 70, and to external connectors to a power source by other interconnect structures in various dielectric layers. A person having ordinary skill in the art will readily understand how these structures may be implemented.

An embodiment is a circuit. The circuit includes active circuitry, a first capacitor, a first fuse, a second capacitor, and a second fuse. The active circuitry has a first power node and a second power node. The first capacitor is coupled to the first fuse serially to form a first segment. The second capacitor is coupled to the second fuse serially to form a second segment. The first segment and the second segment are coupled together in parallel and between the first power node and the second power node.

Another embodiment is a circuit. The circuit includes an array of capacitors, fuses, and active circuitry. Each of the capacitors is coupled in series with at least one of the fuses. The respective serially coupled fuses and capacitors are coupled between a first power rail and a second power rail. The active circuitry is coupled between the first power rail and the second power rail.

A further embodiment is a method. The method includes providing a circuit comprising active circuitry coupled in parallel with a capacitor bank between a first power rail and a second power rail. The capacitor bank comprises multiple segments, and each of the multiple segments comprises a fuse serially coupled to a capacitor. The fuse of at least one of the multiple segments is blown.

Another embodiment is a circuit. The circuit includes active circuitry having a first power node and a second power node. The circuit further includes a first capacitor, a first fuse, and a first conductive element electrically interposed between the first fuse and the first capacitor, the first capacitor being coupled to the first fuse serially to form a first segment, wherein the first conductive element and the first capacitor are in a first dielectric layer, an upper surface of the first conductive element being coplanar with an upper surface of the first dielectric layer. The circuit further includes a second capacitor, a second fuse, and a second conductive line electrically interposed between the second fuse and the second capacitor, the second capacitor being coupled to the second fuse serially to form a second segment, the first segment and the second segment being coupled together in parallel and between the first power node and the second power node.

Another embodiment is a circuit. The circuit includes a substrate, and active circuitry having a first power node and a second power node. The circuit further includes a plurality of segments electrically coupled in parallel between the first power node and the second power node, each of the segments comprising a capacitor electrically coupled to a fuse by a conductive element, wherein the capacitor is in a dielectric layer, an upper surface of the dielectric being level with an upper surface of the conductive element.

Another embodiment is a circuit. The circuit includes a substrate and active circuitry having a first power node and a second power node. The circuit further includes a first capacitor and a first fuse, the first capacitor being coupled to the first fuse serially by a first conductive line to form a first segment, the first fuse being in a first dielectric layer over the substrate, the first capacitor being in a second dielectric layer over the substrate, the second dielectric layer being different than the first dielectric layer, an upper surface of the first conductive line being level with an upper surface of the second dielectric layer, and a second capacitor and a second fuse, the second capacitor being coupled to the second fuse serially by a second conductive line to form a second segment, the first segment and the second segment being coupled together in parallel and between the first power node and the second power node.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
   active circuitry having a first power node and a second power node;
   a first capacitor, a first fuse, and a first conductive element electrically interposed between the first fuse and the first capacitor, the first capacitor being coupled to the first fuse serially to form a first segment, wherein the first fuse is in a first dielectric layer, the first conductive element and the first capacitor are in a second dielectric layer, the first dielectric layer extending along sidewalls and a bottom of the first fuse, an upper surface of the first conductive element being coplanar with an upper surface of the second dielectric layer; and
   a second capacitor, a second fuse, and a second conductive element electrically interposed between the second fuse and the second capacitor, the second capacitor being coupled to the second fuse serially to form a second segment, wherein the second conductive element and the second capacitor are in a third dielectric layer over the second dielectric layer, the first segment and the second segment being coupled together in parallel and between the first power node and the second power node.

2. The circuit of claim 1, wherein the first fuse and the second fuse are each an electrical fuse.

3. The circuit of claim 1, wherein the first capacitor and the second capacitor are each a metal-insulator-metal (MiM) capacitor.

4. The circuit of claim 1, wherein the active circuitry is at least part of a System-On-Chip (SOC).

5. The circuit of claim 1, wherein the active circuitry is at least part of a three dimensional integrated circuit (3DIC).

6. The circuit of claim 1 further comprising a power supply coupled between the first power node and the second power node.

7. A circuit comprising:
   a substrate;
   active circuitry having a first power node and a second power node; and
   a plurality of segments electrically coupled in parallel between the first power node and the second power node, each of the segments comprising a capacitor electrically coupled to a fuse by a conductive element, wherein a first capacitor of a first segment is in a first dielectric layer and a first fuse of the first segment is in a second dielectric layer, the second dielectric layer extending along a bottom surface of the first fuse, an upper surface of the first dielectric layer being level with an upper surface of the conductive element.

8. The circuit of claim 7, wherein the fuse is an electrical fuse.

9. The circuit of claim 8, wherein each segment further comprises dummy segments adjacent opposing sides of a fuse element of the fuse.

10. The circuit of claim 9, wherein the dummy segments extend an entire length of the fuse.

11. The circuit of claim 9, wherein the dummy segments overlap fuse contact pads on opposing sides of the fuse element.

12. The circuit of claim 7, wherein the capacitor is a metal-insulator-metal (MiM) capacitor.

13. The circuit of claim 7, wherein the active circuitry is at least part of a System-On-Chip (SOC).

14. A circuit comprising:
   a substrate;
   active circuitry having a first power node and a second power node;
   a first capacitor and a first fuse, the first capacitor being coupled to the first fuse serially by a first conductive line to form a first segment, the first fuse being in a first dielectric layer over the substrate, the first dielectric layer contacting a bottom surface of the first fuse, the first capacitor being in a second dielectric layer over the substrate, the second dielectric layer being different than the first dielectric layer, an upper surface of the first conductive line being level with an upper surface of the second dielectric layer; and
   a second capacitor and a second fuse, the second capacitor being coupled to the second fuse serially by a second conductive line to form a second segment, the second fuse being in a third dielectric layer over the second dielectric layer, the second capacitor being in a fourth dielectric layer over the third dielectric layer, the first segment and the second segment being coupled together in parallel and between the first power node and the second power node.

15. The circuit of claim 14, wherein the second dielectric layer is over the first dielectric layer.

16. The circuit of claim 14, wherein the first fuse or the second fuse comprises:
   a first contact pad;
   a second contact pad;
   a fuse element interposed between the first contact pad and the second contact pad, the fuse element having a smaller width than the first contact pad and the second contact pad; and
   a dummy portion alongside the fuse element.

17. The circuit of claim 16, wherein the dummy portion extends alongside the first contact pad.

18. The circuit of claim 17, wherein the dummy portion extends alongside the second contact pad.

19. The circuit of claim 14, wherein the second fuse is positioned laterally above the first fuse.

20. The circuit of claim 19, wherein the second capacitor is positioned laterally above the first capacitor.

\* \* \* \* \*